United States Patent
Kumar et al.

(10) Patent No.: US 10,115,456 B2
(45) Date of Patent: Oct. 30, 2018

(54) MULTI-STATES NONVOLATILE OPTO-FERROELECTRIC MEMORY MATERIAL AND PROCESS FOR PREPARING THE SAME THEREOF

(71) Applicant: Council of Scientific & Industrial Research, New Delhi (IN)

(72) Inventors: Ashok Kumar, New Delhi (IN); Hitesh Borkar, New Delhi (IN); Vaibhav Rao, New Delhi (IN); Monika Tomar, New Delhi (IN); Vinay Gupta, New Delhi (IN)

(73) Assignee: Council of Scientific & Industrial Research (IN)

( * ) Notice: Subject to any disclaimer, the term of this patent is extended or adjusted under 35 U.S.C. 154(b) by 0 days.

(21) Appl. No.: 15/406,236

(22) Filed: Jan. 13, 2017

(65) Prior Publication Data

US 2017/0206952 A1    Jul. 20, 2017

(30) Foreign Application Priority Data

Jan. 14, 2016 (IN) .............................. 201611001338

(51) Int. Cl.
*G11C 11/00* (2006.01)
*B05D 5/12* (2006.01)
(Continued)

(52) U.S. Cl.
CPC ................ *G11C 11/42* (2013.01); *B05D 5/12* (2013.01); *G11C 11/2273* (2013.01); *G11C 11/2275* (2013.01); *H01L 28/55* (2013.01)

(58) Field of Classification Search
CPC ......... H01L 21/28291; H01L 27/11502; H01L 28/55; H01L 29/516; H01L 31/00;
(Continued)

(56) References Cited

U.S. PATENT DOCUMENTS 5,112,433 A * 5/1992 Dawson .............. C04B 35/4682
    252/62.9 R
6,066,581 A * 5/2000 Chivukula ............ C04B 35/491
    106/287.19
(Continued)

FOREIGN PATENT DOCUMENTS

EP          1411031 A1    4/2004
WO    WO 2002/102712    12/2002

OTHER PUBLICATIONS

Yoneda et al, "Temperature dependence of piezoelectric constants of lithium bismuth (Li0.5Bi0.5)-modified PZT (lead zirconate-lead titanate) ceramics in the vicinity of the morphotropic phase boundary", Nippon Seramikkusu Kyokai Gakujutsu Ronbunshi (1990), 98(8), 890-4. (Year: 1990).*

(Continued)

*Primary Examiner* — Mark T Kopec
(74) *Attorney, Agent, or Firm* — Blank Rome LLP

(57) ABSTRACT

The invention deals with multi-states nonvolatile opto-ferroelectric memory element and method of preparing the same thereof. This invention describes multi-states nonvolatile opto-ferroelectric memory element consisting of opto-ferroelectric memory material comprised of $Pb_{1-x}(Bi_{0.5}Li_{0.5})_x(Ti_{1-y}Zr_y)O_3$, wherein x=0.2 to 0.8 and y=0.2 to 0.6, said memory material (PBLZT) photovoltaic ferroelectric material is characterized by a single-phase opto-ferroelectric materials, photovoltaic and multi-states ferroelectric memory material. The invention relates to process of preparing multi-states nonvolatile opto-ferroelectric memory material by solid route, solution-gel process and pulsed laser process. It describes development of multi-states nonvolatile opto-ferroelectric memory material at room temperature. Invention describes a ferroelectric material whose polariza- (Continued)

tion is switched by white light and low power LASER (10-50 mW) with wavelength (405 nm).

14 Claims, 14 Drawing Sheets

(51) Int. Cl.
*G11C 11/42* (2006.01)
*G11C 11/22* (2006.01)
*H01L 49/02* (2006.01)

(58) Field of Classification Search
CPC . H01L 31/0232; C23C 14/088; C23C 16/409; G11C 11/42; B05D 5/12
See application file for complete search history.

(56) References Cited

U.S. PATENT DOCUMENTS

| | | | |
|---|---|---|---|
| 6,778,442 | B1 | 8/2004 | Hamilton et al. |
| 7,050,323 | B2 | 5/2006 | Takahashi et al. |
| 7,205,256 | B2 | 4/2007 | Kijima et al. |
| 7,956,519 | B2 | 6/2011 | Natori et al. |
| 2011/0308580 | A1 | 12/2011 | Seidel et al. |
| 2013/0022839 | A1* | 1/2013 | Kijima ............ C01G 23/003 428/701 |
| 2013/0037092 | A1 | 2/2013 | Cheong et al. |

OTHER PUBLICATIONS

Yoneda et al "Composite piezoelectric ceramics of (LiBi)1/2-modified PZT system", Japanese Journal of Applied Physics, Part 1: Regular Papers, Short Notes & Review Papers (1989), 28(Suppl. 28-2), 95-7 (Year: 1989).*
Chen et al "Microstructure and Electrical Properties of (1-x)Bi(Li1/3Zr2/3)O3—xPbTiO3 Piezoelectric Ceramics", J. Am. Chem. Soc. 93(6) 1692-1696. (Year: 2010).*
Thomas "PZT(65/35) and PLZT(8/65/35) thin films by sol-gel process . . . ", Thin Solid Films 443 (2003) 14-22. (Year: 2003).*
Wang et al "Piezoresponse and ferroelectric properties of lead-free [Bi0.5(Na0.7K0.2Li0.1)0.5]TiO3 thin films by pulsed laser deposition", Applied Physics Letters 92, 222909 (2008). (Year: 2008).*
Zhang et al "Electronic properties of A-site substituted lead zirconate titanate . . . ", Physical Review B 76, 125102 (2007). (Year: 2007).*
J. F. Scott, "Ferroelectric Memories—(FeRAM)", Springer-Verlag, Chap. 2.1, 2000, pp. 25-41.
Grinberg et al. "Perovskite oxides for visible-light-absorbing ferroelectric and photovoltaic materials" Nature 503, 509, doi:10.1038/nature12622; pp. 1-9 (2013).
Guo et al. "Non-volatile memory based on the ferroelectric photovoltaic effect", Nature Communications 2990; 4:1990, DOI: 10.1038/ncomms2990, pp. 1-5 (2013).
J. Kreisel et al. "A photoferroelectric material is more than the sum of its parts" Nature Materials, vol. 11, p. 260 (2012).

* cited by examiner

MULTI-STATES NONVOLATILE OPTO-FERROELECTRIC MEMORY MATERIAL AND PROCESS FOR PREPARING THE SAME THEREOF

FIELD OF THE INVENTION

The present invention relates to Multi-States Nonvolatile Opto-Ferroelectric Memory material and its process for preparing the same thereof. It relates to A-site and B-site substituted $Pb_{1-x}(Bi_{0.5}Li_{0.5})_x(Ti_{1-y}Zr_y)O_3$ (x=0.2 to 0.8, and y=0.2 to 0.6) ferroelectric materials as opto-ferroelectric materials for multi-states nonvolatile memory elements. In particular, the present invention relates to use of white light and weak monochromatic laser source (405 nm) to create several logic states for nonvolatile memory elements. The invention also provides a method for the development of optically active ferroelectric materials using a process which makes fabricated single phase ferroelectric materials at room temperature. The invention also narrates the photoferroelectric photovoltaic effect with switchable open circuit voltage and high ON/OFF photocurrent under visible light and portable 405 nm wavelength laser light. It also relates the relative small fatigue under high electric field (E) stress for long period of time to test the utility of device for memory applications. These $Pb_{1-x}(Bi_{0.5}Li_{0.5})_x(Ti_{1-y}Zr_y)O_3$ (x=0.2 to 0.8, and y=0.2 to 0.6) systems could be used for a variety of applications such as opto-ferroelectric nonvolatile multi-state memory, visible/weak UV light detector, and perovskite based photovoltaic etc.

BACKGROUND OF THE INVENTION

The present generation of human kinds is fascinated towards small and beautiful microelectronic devices. In this regard, future microelectronic industries require tiny device area with more and more data bits i.e. large logic bits density with low power consumption and less heat dissipation. Our microelectronic devices and their technology node have reached a threshold condition where classical physics assumptions, boundary conditions, and related physics have failed to explain the unusual physical and functional properties due to tunneling effect and wave-particle duality. Memory industry physicists and technocrats are also facing another major challenge to control the excessive heat dissipation and large leakage current with lowering the physical thickness of devices to increase more and more bit densities. Moore's Law predicts the doubling of integrated circuit after each two years, which is valid till now, however the fast progress in the data storage technologies cannot meet the requirements just by the miniaturizing of devices. At present we need something more than Moore's law in terms of the materials as well design. Ferroelectric memory industries are also facing the similar problems; the potential materials show poor charge retention and large leakage with reduction of size. Therefore, it is imperative to develop novel ferroelectric materials and phenomenon for high component density memory devices with low power consumption. In this context, optically control of polarization is highly expected to help the industry to a regime beyond the Moore's law.

Prof J. F. Scott, University of Cambridge, UK, which is also known as father of ferroelectric memory, has developed and proposed several ferroelectric materials and processes to develop commercial ferroelectric random access memory (FeRAM), (J. F. Scott, Ferroelectric memories, Springer-Verlag, (2000)).

U.S. Pat. Nos. 6,778,422 and 7,050,323 propose a non-volatile memory cell in the form of static random access memory, which was composed of ferroelectric capacitors and transistors for amplification and allows high speed write and read applications. It emphasized basically the electric circuits; cell array and its connections with ferroelectric capacitors for high speed output write and read process. The embedded ferroelectric capacitors comprise of very common lead zirconate titanate (PZT) ferroelectric materials, based on electrically high speed write and read process of ferroelectric capacitors and transistors for amplification in contrast with present approach of optically read process for multi logic states.

U.S. Pat. No. 7,205,256 B2 proposes the fabrication of several perovskite ferroelectric thin films utilizing the modified solution-deposition technique, preparation of gel-solution for forming the perovskite or lamellar perovskite structure oxide formed by mixing of alkoxides or organic acidic salts of two or more kind of metals required for the desired ferroelectric materials.

European patent No: EP 1411031 A1/WO 2002/102712 deals with a process for manufacturing the ferroelectric ceramics/films having oxygen octahedral with layered structure and paraelectric materials for catalyst.

US patent No: US 20130037092A1 claims the diode like characteristic of ferroelectric $BiFeO_3$ (BFO) thin films sandwiched between semitransparent electrodes. US patent No: Pub. No.: US 20110308580 A1 describes the ferroic $BiFeO_3$ material for nano-electronics, logic circuits, and memory device applications. This invention describes the intrinsic conducting domain walls separated by insulating walls and therein the formation of controlled network of 2 nm conducing walls on the 2D insulating sheet. It also provides the methods of writing, reading, erasing, and manipulating the conducting walls for memory applications. According to various embodiments, optoelectronics and photovoltaic devices are described. The major drawbacks of these patents are as follows: (i) it deals with highly conducting $BiFeO_3$ thin films contrast to our novel materials, (ii) major focus on the switching behavior of photocurrent and diode characteristics, and (iii) do not illustrate with the switching of ferroelectric polarization or displacement currents.

References may be made to Nature Communications|4: 1990|DOI: 10.1038/ncomms2990, (2013) wherein Guo et al., reported the Non-volatile memory based on the ferroelectric photovoltaic effect. Another recent discovery on development of perovskite oxides for visible-light-absorbing ferroelectric and photovoltaic materials are described by Ilya Grinberg et al., in Nature, 503, 509 (2013); doi:10.1038/nature12622.

Generally classical ferroelectrics are well known that any kind of leakage current is detrimental for polarization switching based nonvolatile memory elements. However it has been established that rectification direction and the direction of photovoltaic current are closely related to the direction of electric polarization of ferroelectric photovoltaic. In this regard, our present invention can be utilized for potentially low energy, high density, low power, and less heat dissipation nonvolatile multi states memory elements, photodetectors, interface mediated photovoltaic to tunnel the photocurrent with above bandgap open circuit voltage, and also domain walls based photo energy harvesters.

Another reference made to Nature materials, 11, 260, (2012) wherein J. Kreisel, M. Alexe and P. A. Thomas explained the importance of photoferroelectric material and emphasized that it is more than the sum of its parts. Above mentioned reports basically demonstrate the photovoltaic aspect of the ferroelectric photovoltaic, wherein our present invention deals with novel single phase ferroelectric material with significant photocurrent and optically switchable polarization.

Most of the prior art deals with the electrically write and read process of ferroelectric polarization for nonvolatile memories require high power consumption and large area device miniaturization.

The present invention is about the optically active classes of ferroelectric materials where optical control of polarization is expected to play a pivotal role in memory devices to meet with the current demands. The present invention deals with the electrically write and optically read process which may provide nanoelectronic devices with low power consumption, less heat dissipation, and tiny device area. Among all the prior arts, $BiFeO_3$ has shown ferroelectric photovoltaic property due to inbuilt polarization; however present invention also shows another family of perovskite with high ON/OFF switching current, open circuit voltage, and short circuit current. Our invention allows much faster approach for read and write operation ferroelectric capacitors and transistors which deal with optical monochromatic laser light and white light. Another aspect of this invention is to provide a plurality of the above diodes in an electronic memory device. It also provides a photovoltaic device of single crystalline polar ferroelectric sandwiched between two semi-crystalline electrodes. Another aspect of this invention includes the solar cell based on the polarization of ferroelectric; these cells may either connected in series or parallel.

OBJECTIVES OF THE INVENTION

The main objective of the present invention is to develop multi-States Nonvolatile Opto-Ferroelectric Memory material.

Another objective of the present invention is the development of optically sensitive ferroelectric materials for nonvolatile memory applications.

Still another objective of the present invention is to develop new optically active $Pb_{1-x}(Bi_{0.5}Li_{0.5})_x(Ti_{1-y}Zr_y)O_3$ (x=0.2 to 0.8, and y=0.2 to 0.6) (PBLZT) ferroelectric materials with different doping compositions, where PBLZT is the acronym for $Pb_{1-x}(Bi_{0.5}Li_{0.5})_x(Ti_{1-y}Zr_y)O_3$ throughout the document.

Yet another objective of the present invention is to provide a method for the development of the $Pb_{1-x}(Bi_{0.5}Li_{0.5})_x(Ti_{1-y}Zr_y)O_3$ (x=0.2 to 0.8, and y=0.2 to 0.6) (PBLZT) opto-ferroelectric materials.

Still yet another objective of the present invention is to provide a high photo response of PBLZT ferroelectric material under the illumination of white light or monochromatic laser with particular wavelength (405 nm).

Still another objective of the present invention is to develop a process for the preparation of multi-States Nonvolatile Opto-Ferroelectric Memory material.

Yet another objective of the present invention is to develop PBLZT ferroelectrics which have shown high open circuit voltage. It is also switchable under the poling polarity for bulk electro-ceramics which is useful as photovoltaic materials and devices.

Still another objective of the present invention is to develop switchable polarization property for multi states logic memory elements, depending on the frequency and strength of illuminating light, both white and monochromatic light.

SUMMARY OF THE INVENTION

Accordingly, the present invention provides a Multi-States Nonvolatile Opto-Ferroelectric Memory element at room temperature. It comprising a $Pb_{1-x}(Bi_{0.5}Li_{0.5})_x(Ti_{1-y}Zr_y)O_3$ (x=0.4 & 0.5, and y=0.2) (PBLZT) photo-voltaic ferroelectric materials, characterized by a single-phase, opto-ferroelectric materials, photovoltaic, multi-states ferroelectric memory elements. The miniaturization of devices need low power, low energy, and low heat dissipation high density electronics for non-volatile memory elements and logic. Invention describes a ferroelectric material whose polarization is switched by white light and low power LASER (10-50 mW) with wavelength (405 nm).

In another embodiment of the invention, the opto-ferroelectric memory element is characterized by white light tungsten filament (20-100 $mW/cm^2$), white light xenon lamp (20-100 $mW/cm^2$) and monochromatic 405 nm (30-50 mW) wavelength light source.

Accordingly, the present invention also provides a process for the preparation of opto-ferroelectric material, comprising process steps of:

I. physical mixing of ingredient oxides of PbO (99.5%), $ZrO_2$ (99.86%), $TiO_2$ (99.96%), $Bi_2O_3$ (99.99%) and $Li_2CO_3$ (97%) (Alfa Aesar) in a ratio in the range of x=0.2 to 0.8, and y=0.2 to 0.6 with further mechanical mixing in liquid alcoholic (IPA) media in range of 5 to 10 ml with 99.9% purity, and mol fraction of electro-ceramics;

II. calcining composites of step (i) at a temperature in the range of 800-850° C. for a period of 11-13 hours to get the desired phase followed by X-ray diffraction (XRD) study to verify the phase purity and crystallinity;

III. sintering composites of step (ii) at a temperature in the range of 1100-1200° C., to obtain desired opto-ferroelectric material; and IV. sintered composites of step (iii) were further processed for mechanical grinding and polishing to get the desired thickness in the range of 400 to 600 microns of opto-ferroelectric material.

DETAILED DESCRIPTION OF THE INVENTION

Figure 1:
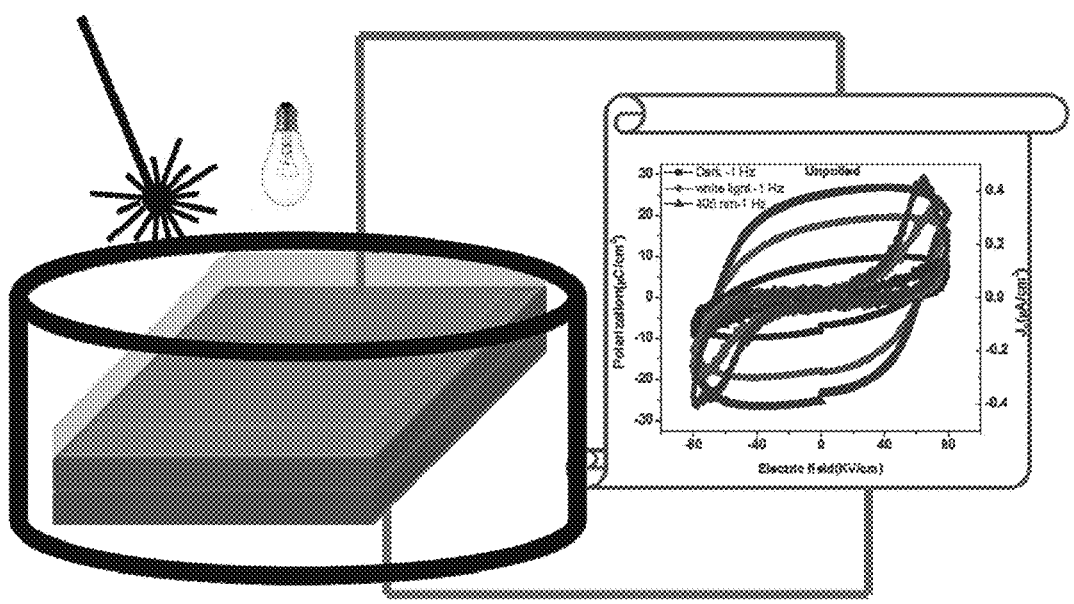
FIG. 1 is a schematic representation of opto-ferroelectric memory devices and characterization process. An electro-ceramic pellet in metal-insulator-metal (ITO/PBLZT/Ag) configuration is immersed in transformer oil with light gadgets on the top and transparent side of side of sandwiched ferroelectric materials to switch the polarization.

While the present invention is susceptible to various modifications and alternative forms, specific embodiment thereof has been shown by way of example in the figures and will be described in detail below. It should be understood, however that it is not intended to limit the invention to the particular forms disclosed, but on the contrary, the invention is to cover all modifications, equivalents, and alternative falling within the spirit and the scope of the invention as defined by the appended claims.

Before describing in detail the various embodiments of the present invention it may be observed that the novelty and inventive step that are in accordance with the present invention resides in the construction of switch module. It is to be noted that a person skilled in the art can be motivated from the present invention and modify the various constructions of switch module. However, such modification should be construed within the scope and spirit of the invention.

Accordingly, the drawings are showing only those specific details that are pertinent to understanding the embodiments of the present invention so as not to obscure the disclosure with details that will be readily apparent to those of ordinary skill in the art having benefit of the description herein.

The terms "comprises", "comprising", "including" or any other variations thereof, are intended to cover a non-exclusive inclusion, such that an assembly, mechanism, setup, that comprises a list of components does not include only those components but may include other components not expressly listed or inherent to such assembly, mechanism or setup. In other words, one or more elements in switch module or assembly proceeded by "comprises a" does not, without more constraints, preclude the existence of other elements or additional elements in the assembly or mechanism. The following paragraphs explain present invention and the same may be deduced accordingly.

As used hereinafter, the following terms shall have the following definitions:

"Opto-ferroelectric" refers the effect of white light and/or monochromatic light on induced dielectric polarization of a material in an external stress of electric field.

"Photovoltaic" refers the effect of white light and/or monochromatic light on open circuit and short circuit current.

"Remanent polarization, Pr" refers to the spontaneous polarization under the application of external field of zero bias.

"Photosensitive" refers the effect of white light and/or monochromatic light on ON/OFF states of the photocurrents.

"Coercive E-field," Ec refers to the electric field which is used to switch the polarization to generate the different logic state for memory applications. The E-field frequency is 1 Hz to 10 50 Hz for the purpose of this description.

"Leakage current density" (J) refers to the current per unit area, measured as a function of applied electric field.

"Polarization fatigue" refers to the loss in polarization after certain number of cycles of device utility.

"Room temperature" refers to temperature of 296 K.

The composite Pb1−x(Bi0.5Li0.5)x(Ti1−yZry)O3 (x=0.4 and y=0.2) is referred to as PBLZT (x=0.4 and y=0.2) for the purpose of this description.

The present invention relates to a multi-states nonvolatile opto-ferroelectric memory element consisting of opto-ferroelectric memory material comprised of:

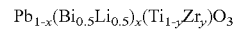

wherein x=0.2 to 0.8
y=0.2 to 0.6 said memory material (PBLZT) photovoltaic ferroelectric material is characterized by a single-phase, opto-ferroelectric materials, photovoltaic and multi-states ferroelectric memory elements.

The present invention relates to methods for producing said opto-ferroelectric memory material and uses thereof. All the terms used have the same meaning as is used in general aspect of the art, unless otherwise specified.

The present invention provides a class of single phase, opto-ferroelectric materials belonging to the perovskite crystal structure and prepared with the solid state reaction route. An aspect of the present invention provides a composition $Pb_{1-x}(Bi_{0.5}Li_{0.5})_x(Ti_{1-y}Zr_y)O_3$ (x=0.2 to 0.8, and y=0.2 to 0.6) (PBLZT) that exhibits switching of remanent polarization under illumination white light and monochromatic laser source with 405 nm wavelength.

An aspect of the present invention provides a room temperature $Pb_{1-x}(Bi_{0.5}Li_{0.5})_x(Ti_{1-y}Zr_y)O_3$ (x=0.2 to 0.8, and y=0.2 to 0.6) (PBLZT) opto-ferroelectric used as opto-electric logic states, which implies nonvolatile memory elements with an electric voltage for WRITE/READ operation and various optical signals for READ/WRITE operation and vice-versa and dual operation together.

An aspect of the present invention provides opto-ferroelectric samples of $Pb_{1-x}(Bi_{0.5}Li_{0.5})_x(Ti_{1-y}Zr_y)O_3$ (x=0.2 to 0.8, and y=0.2 to 0.6) (PBLZT) fabricated by a solid state reaction method (method 1) comprising steps of: appropriate analytical-purity oxides, mechanical mixing; calcinations of physical mixture at 800-850° C. for 12 h to obtain the perovskite phase; sintering the pellets in a temperature range of 1100-1200° C. for 2 to 4 h; and further pressure polishing to reduced the thickness near 500 µm.

An aspect of the present invention provides the transparent ITO coating on the top surface of opto-ferroelectric materials, the above said electro-ceramic pellets were top coated by transparent conducting Indium tin oxide (ITO) electrode using rf magnetron sputtering method and bottom by the conducting silver paints to further opto-electrical characterization; In several cases semi transparent silver paint was also used for opto-electrical measurement.

Another aspect of the present invention provides a composition $Pb_{1-x}(Bi_{0.5}Li_{0.5})_x(Ti_{1-y}Zr_y)O_3$ (x=0.2 to 0.8, and y=0.2 to 0.6) (PBLZT) that exhibits ON/OFF states of photocurrent under illumination of white light and monochromatic laser source with 405 nm wavelength. ON/OFF states of photocurrent were tested under small stress electric voltage (+/−110 V and +/−40 V @ 500 µm thick pellets).

Another aspect of the present invention provides an opto-ferroelectric material with in-built spontaneous polarization of 4-30 µC/cm² with and without illumination of light from near UV to visible region frequencies i.e different probe frequencies (0.1 Hz-10 Hz) under the electric field stress of +/−80 KV/cm and with various strength of the illuminating light. FIG. 1 shows the P-E hysteresis of unpoled $Pb_{1-x}(Bi_{0.5}Li_{0.5})_x(Ti_{1-y}Zr_y)O_3$ (x=0.4 and y=0.2) with and without illumination of light. A large change, in the range of 300-500% in switching of polarization under 40 mW 405 nm laser light and in the range of 100-250% in switching of polarization under white light was obtained depending of probe frequency, electrical stress, and energy of the light. The compositions PBLZT (x=0.5 and y=0.2) also shows 10-20% less polarization switching compared to $Pb_{1-x}(Bi_{0.5}Li_{0.5})_x(Ti_{1-y}Zr_y)O_3$ (x=0.4 and y=0.2), other compositions are also contemplated.

Accordingly, the present invention also provides a process for the preparation of opto-ferroelectric material, comprising process steps of:
I. physical mixing of ingredient oxides of PbO (99.5%), $ZrO_2$ (99.86%), $TiO_2$ (99.96%), $Bi_2O_3$ (99.99%) and $Li_2CO_3$ (97%) (Alfa Aesar) in a ratio in the range of x=0.2 to 0.8, and y=0.2 to 0.6 with further mechanical mixing in liquid alcoholic (IPA) media in range of 5 to 10 ml with 99.9% purity, and mol fraction of electro-ceramics;
II. calcining composites of step (i) at a temperature in the range of 800-850° C. for a period of 11-13 hours to get the desired phase followed by X-ray diffraction (XRD) study to verify the phase purity and crystallinity;
III. sintering composites of step (ii) at a temperature in the range of 1100-1200° C., to obtain desired opto-ferroelectric material; and
IV. sintered composites of step (iii) were further processed for mechanical grinding and polishing to get the desired thickness in the range of 400 to 600 microns of opto-ferroelectric material.

In an embodiment of the present invention, opto-ferroelectric materials, wherein the optimized $Pb_{1-x}(Bi_{0.5}Li_{0.5})_x(Ti_{1-y}Zr_y)O_3$ (x=0.4 and y=0.2) and $Pb_{1-x}(Bi_{0.5}Li_{0.5})_x(Ti_{1-y}Zr_y)O_3$ (x=0.5 and y=0.2) compositions have shown very high change in polarization under illumination of white light and 405 nm monochromatic light for opto-ferroelectric memory applications.
i. as obtained electro-ceramic pellets in step (iv) were further characterized by XRD to check the crystal structure, and surface morphology and chemical compositions by scanning electron microscope (SEM);
ii. as obtained electro-ceramic pellets in step (iv) were polished by mechanical pressure technique to make it thin slab of 500 µm;
iii. the above said electro-ceramic pellets were top coated by transparent conducting Indium tin oxide (ITO) electrode using RF magnetron sputtering and bottom by the conducting silver paints to further opto-electrical characterization;
iv. the above said electro-ceramic pellets were kept under transformer oil to avoid electrical spark under high voltage opto-electrical testing;
v. the above said electro-ceramic pellets were tested for optical characterization under tungsten filament bulb white source, 405 nm monochromatic laser light, and near 70% efficient Xenon lamp;
vi. as designed and constructed electro-ceramic pellets in step (vii & Viii) were tested for switchable polarization, displacement current and photocurrent under ON and OFF states of near UV and visible light source;
vii. as designed and constructed electro-ceramic pellets in step (vii & Viii) were tested for small stress voltage for (+/−110 V and +/−40 v with small step size to get the open circuit voltage ($V_{OC}$) and short circuit current ($I_{SC}$) to realize the photovoltaic characterization of above said embodiments.

In yet another embodiment of the present invention, use of white and monochromatic light to switch the polarization states, and hence concerned logic states are provided.

According to various embodiments of the present invention, opto-polarization memory, photovoltaic, optoelectronics are provided.

In yet another embodiment of the present invention, white light and 405 nm wavelength laser source are selected form complete range of near UV and visible light to realize the multi nonvolatile logic states.

In yet another embodiment of the present invention, the ON and OFF states of the photocurrent are selected from various light sources for near UV and visible light detector.

In yet another embodiment of the present invention, electrical stress medium was selected from transformer oil or silicon oil or combination thereof.

According to various embodiments of the present invention, high dielectric constant (<1000) and low tangent loss (<0.05) over a wide range of temperature (<150° C.) and frequency (50 Hz-1 MHz) are provided.

In yet another embodiment of the present invention, photo-luminance of the $Pb_{1-x}(Bi_{0.5}Li_{0.5})_x(Ti_{1-y}Zr_y)O_3$ (x=0.4 & x=0.5 and y=0.2) electro ceramic is high with good blue emission spectra.

In yet another embodiment of the present invention, switching of polarization of $Pb_{1-x}(Bi_{0.5}Li_{0.5})_x(Ti_{1-y}Zr_y)O_3$ (x=0.4 & and y=0.2) first time under 405 nm laser light is in the range 300-500% depending of probe frequency and electrical stress. The above said experiment was tested for several days and found reproducible after 24 hours;

In yet another embodiment of the present invention, fast switching and repeatability of polarization greater than two minutes and less than 30 minutes under 405 nm laser light is in the range 20-50% depending of probe frequency and electrical stress.

Figure 2:
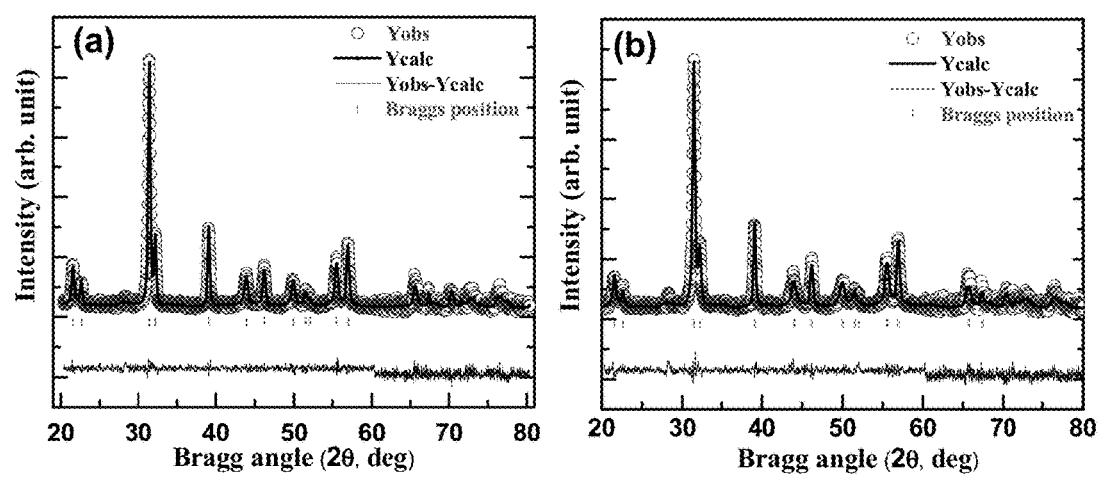
FIGS. 2 (a) & (b) are the XRD patterns of $Pb_{1-x}(Bi_{0.5}Li_{0.5})_x(Ti_{1-y}Zr_y)O_3$ (x=0.4 and y=0.2) and $Pb_{1-x}(Bi_{0.5}Li_{0.5})_x(Ti_{1-y}Zr_y)O_3$ (x=0.5 and y=0.2) composition, respectively represent the tetragonal crystal structure, space group P4 mm (defined crystallographic notation), & lattice parameters, a=b=3.930, c=4.124=>, & a=b=3.932, c=4.117=>, respectively.
Figure 3:
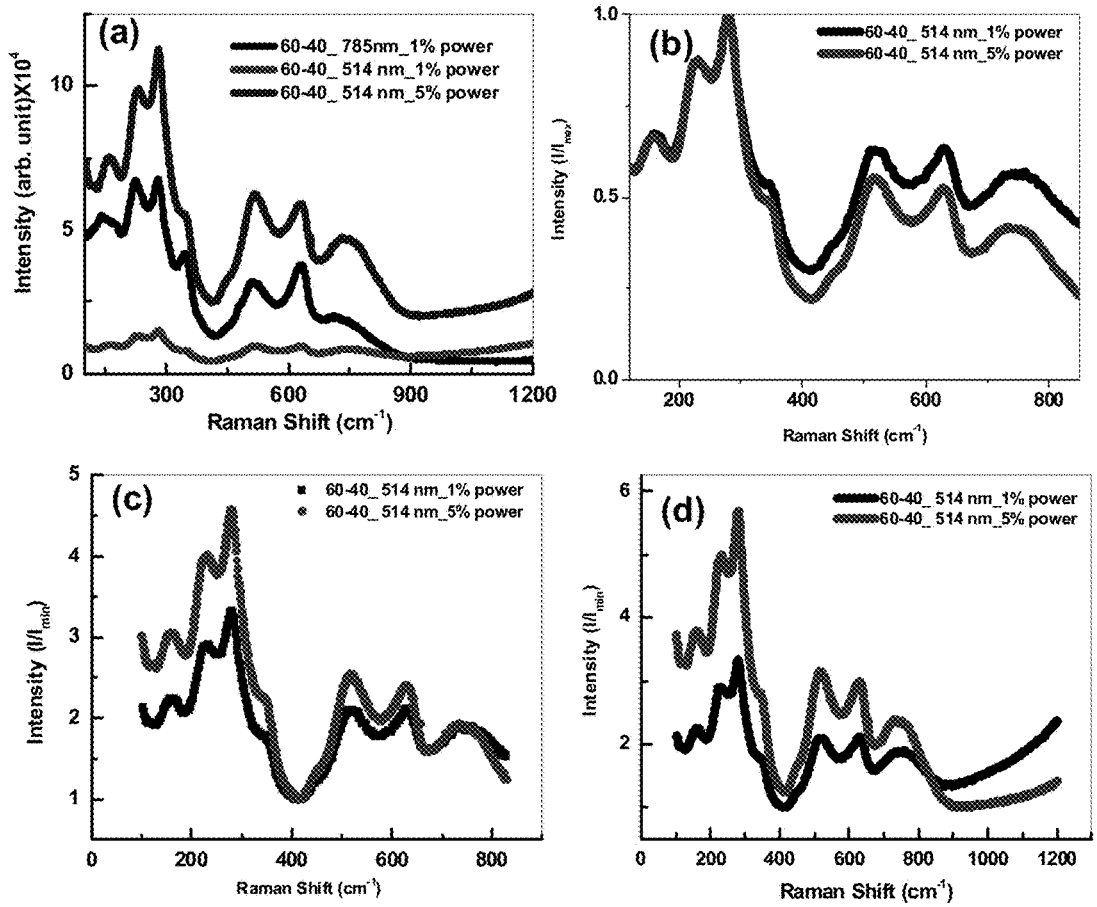
FIG. 3 Room temperature Raman spectra of (a) $Pb_{1-x}(Bi_{0.5}Li_{0.5})_x(Ti_{1-y}Zr_y)O_3$ (x=0.4 and y=0.2) compositions, (a) probed with 514 nm and 785 nm laser illumination, (b,c,&d) rationalized with maximum and minimum intensity.

Another aspect of the present invention provides the tetragonal crystal structure with space group P4mn using XRD (see FIG. 2) and local crystal structure using Raman spectroscopy (FIG. 3) for the composition $Pb_{1-x}(Bi_{0.5}Li_{0.5})_x(Ti_{1-y}Zr_y)O_3$ (x=0.4 and y=0.2).

Figure 4:
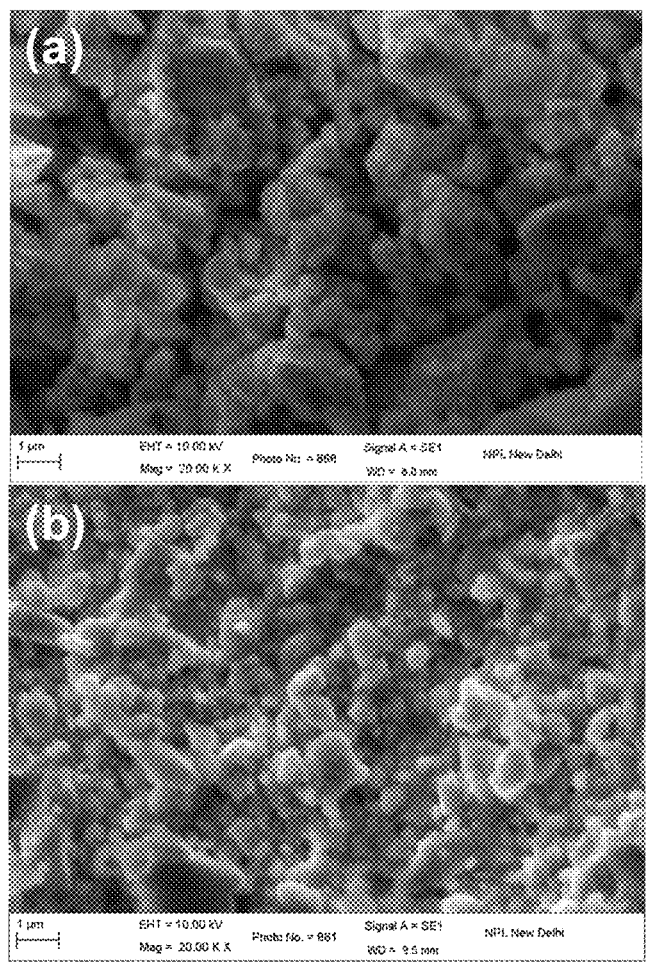
FIG. 4: SEM images of (a) $Pb_{1-x}(Bi_{0.5}Li_{0.5})_x(Ti_{1-y}Zr_y)O_3$ (x=0.4 and y=0.2), (b) $Pb_{1-x}(Bi_{0.5}Li_{0.5})_x(Ti_{1-y}Zr_y)O_3$ (x=0.5 and y=0.2) compositions, with compositions within the experimental limits (+/−10%) of SEM/EDAX.

Another aspect of the present invention provides surface morphology of grains and grain boundaries distribution of (a) $Pb_{1-x}(Bi_{0.5}Li_{0.5})_x(Ti_{1-y}Zr_y)O_3$ (x=0.4 and y=0.2), (b) $Pb_{1-x}(Bi_{0.5}Li_{0.5})_x(Ti_{1-y}Zr_y)O_3$ (x=0.5 and y=0.2) compositions on the top surface/illuminating surface of the pellets, and composition within the experimental limits of SEM/EDAX (FIG. 4).

Figure 5:
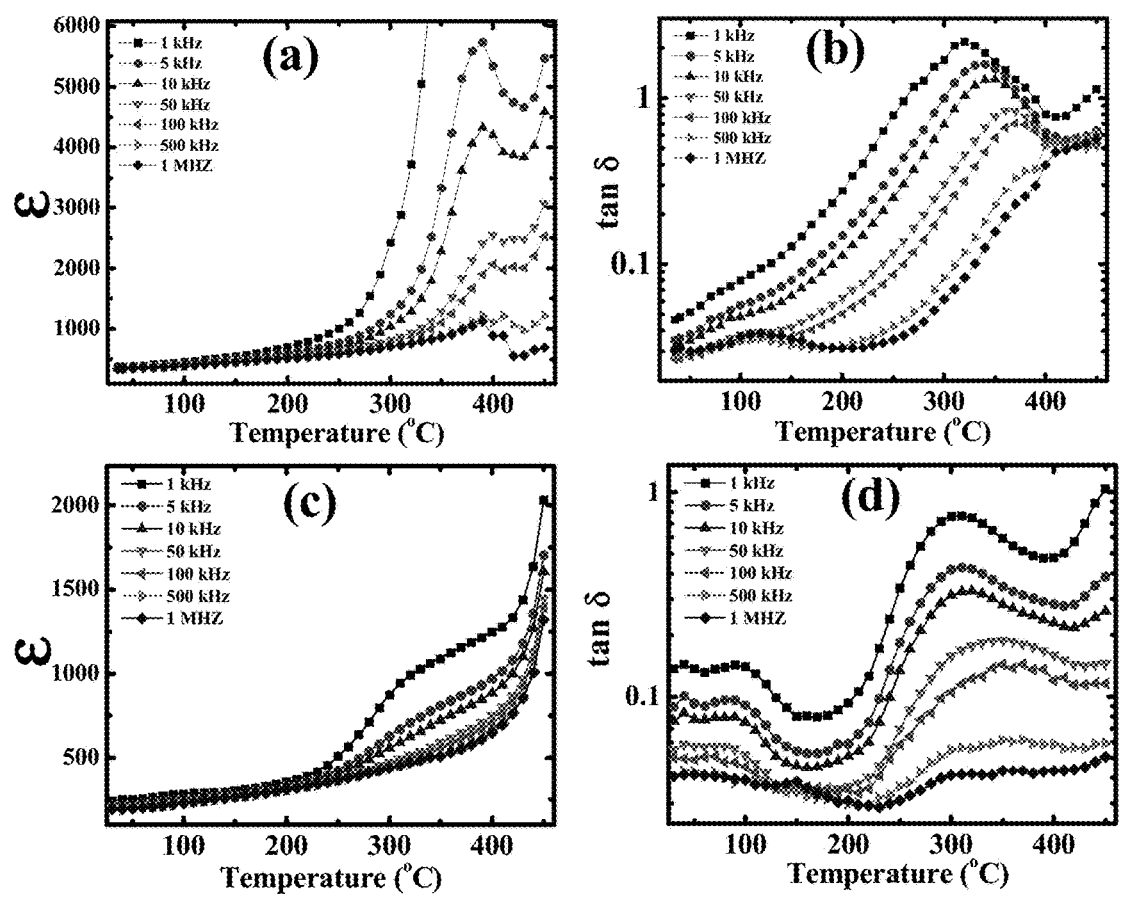
FIG. 5: Temperature and frequency dependent dielectric constant and tangent loss spectra of (a &b) $Pb_{1-x}(Bi_{0.5}Li_{0.5})_x$ $(Ti_{1-y}Zr_y)O_3$ (x=0.4 and y=0.2) and (c & d) $Pb_{1-x}(Bi_{0.5}Li_{0.5})_x$ $(Ti_{1-y}Zr_y)O_3$ (x=0.5 and y=0.2) electroceramics, respectively.

FIG. 5 depicts the dielectric aspect of the present invention that provides temperature and frequency dependent dielectric constant and tangent loss behavior of (a & b) $Pb_{1-x}(Bi_{0.5}Li_{0.5})_x(Ti_{1-y}Zr_y)O_3$ (x=0.4 and y=0.2) (c & d) $Pb_{1-x}(Bi_{0.5}Li_{0.5})_x(Ti_{1-y}Zr_y)O_3$ (x=0.5 and y=0.2) electro-ceramics in dark condition, respectively. It shows high dielectric constant (~250 to 500) and low tangent loss (<0.05) near room temperature; however significant dielectric dispersion were observed in the large frequency span and at elevated temperature till 450° C. A kink in dielectric anomaly was observed from 300° C. to 390° C. due to ferroelectric phase transitions depending on A and B-site compositions.

Figure 6:
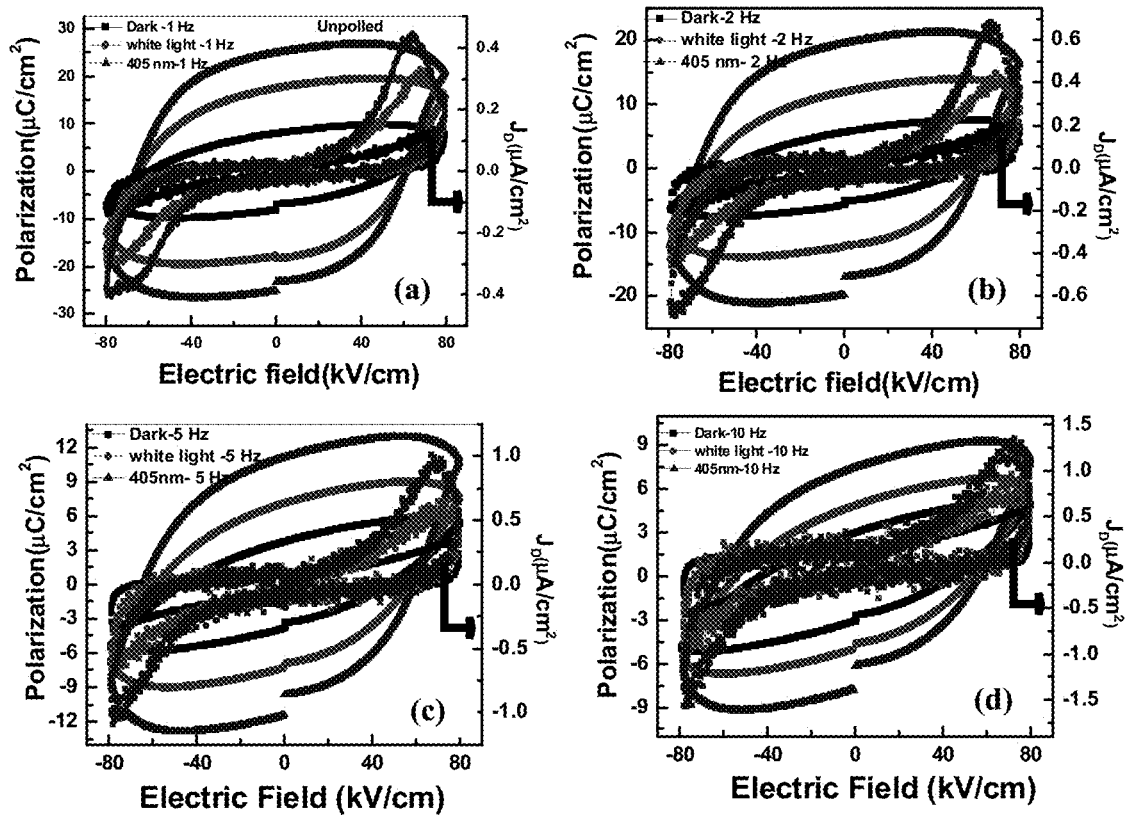
FIG. 6 Opto-ferroelectric polarization vs electric field loops of unpoled $Pb_{1-x}(Bi_{0.5}Li_{0.5})_x(Ti_{1-y}Zr_y)O_3$ (x=0.4 and y=0.2) electroceramics under illumination of various illuminating light.

FIG. 6 (a-d) depicts the variation of polarization versus applied electric field (P-E) and displacement current without light (dark) and with monochromatic 405 nm light and white light for various probe frequencies (a) 1 Hz, (b) 2 Hz, (c) 5 Hz, (d) 10 Hz of unpoled $Pb_{1-x}(Bi_{0.5}Li_{0.5})_x(Ti_{1-y}Zr_y)O_3$ (x=0.4 and y=0.2) electro-ceramics. Proper P-E loops can be obtained for bulk polycrystalline ceramics and single crystal for low probe frequencies. At low probe frequency, displacement current and switchable polarization (technique used: positive-up-negative-down (PUND)) was more prominent and noteworthy under the illumination of light. The displacement current used to READ and WRITE the logic states are more prominent under the illumination of light and vary frequently and fast to create more logic states.

Figure 7:
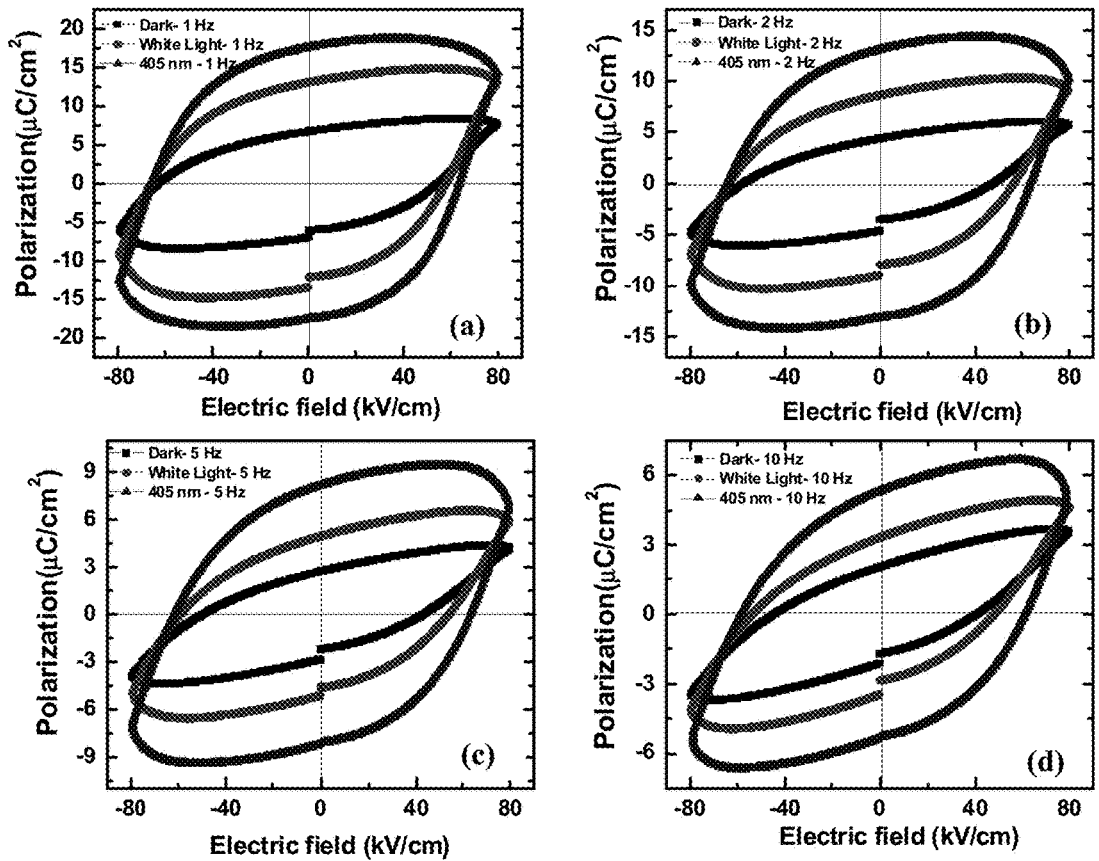
FIG. 7 Opto-ferroelectric polarization versus electric field loops of poled $Pb_{1-x}(Bi_{0.5}Li_{0.5})_x(Ti_{1-y}Zr_y)O_3$ (x=0.4 and y=0.2) electroceramics under illumination of various illuminating light.

Another aspect of the present invention depicts the variation of polarization versus applied electric field (P-E) and displacement current without light (dark) and with monochromatic 405 nm light and white light for various probe frequencies (a) 1 Hz, (b) 2 Hz, (c) 5 Hz, (d) 10 Hz of poled $Pb_{1-x}(Bi_{0.5}Li_{0.5})_x(Ti_{1-y}Zr_y)O_3$ (x=0.4 and y=0.2) electro-ceramics (FIG. 7 (a-d)). Proper P-E loops can be obtained for bulk polycrystalline ceramics and single crystal for low probe frequencies. The displacement current used to READ and WRITE the logic states are more prominent under the illumination of light and vary frequently and fast to create more logic states using different illuminating monochromatic light energy/wavelength.

Figure 8:
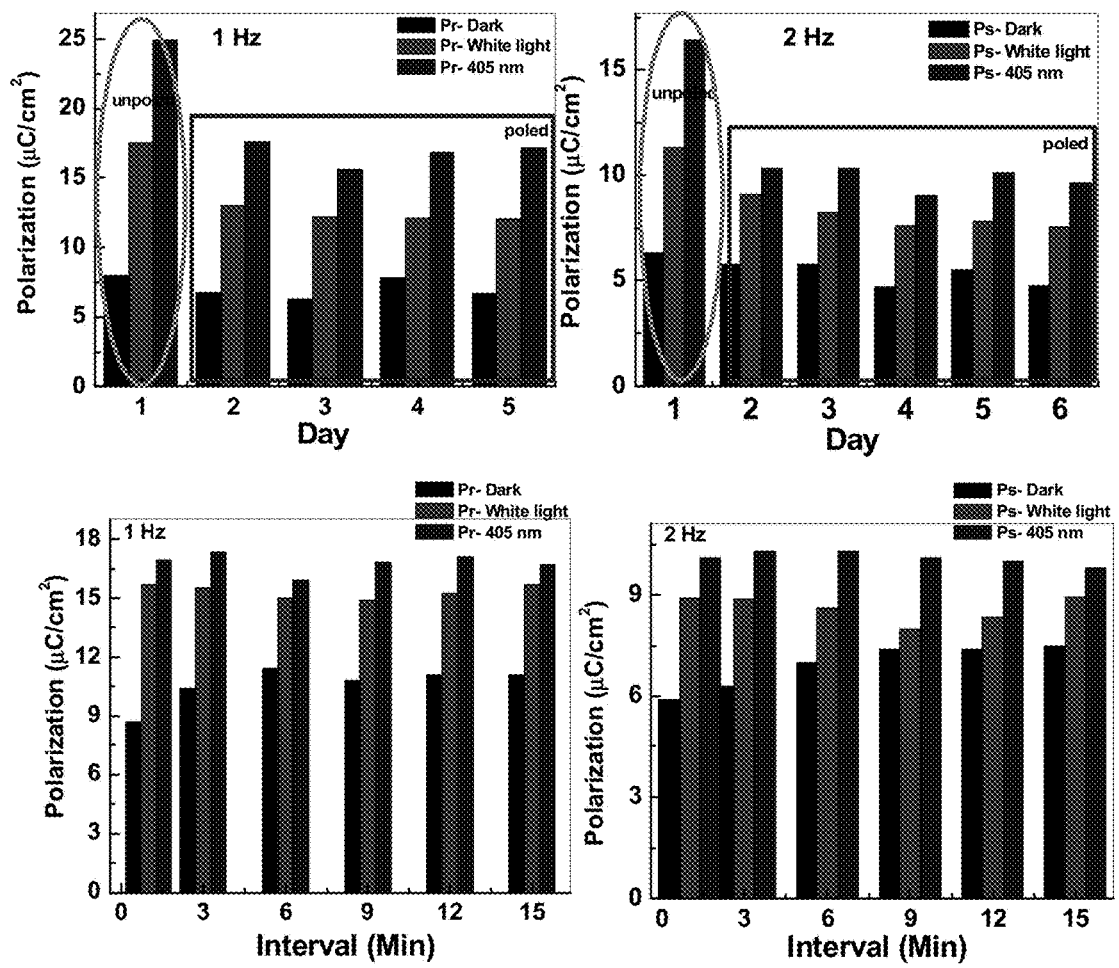
FIG. 8 Bar diagram of Opto-ferroelectric polarization versus days to check the forth-back switching behavior of poled and unpoled $Pb_{1-x}(Bi_{0.5}Li_{0.5})_x(Ti_{1-y}Zr_y)O_3$ (x=0.4 and y=0.2) electroceramics under illumination of various illuminating light.

A bar diagram has shown in FIG. 8 which represents the effective switchable polarization of $Pb_{1-x}(Bi_{0.5}Li_{0.5})_x(Ti_{1-y}Zr_y)O_3$ (x=0.4 and y=0.2) over a period of time. Since the invention was carried out on bulk polycrystalline electro-ceramic samples, the big question was whether we would be able to switch the polarization back to normal. Similar magnitude of switchable dark polarization and under the illumination of white and laser light polarization was obtained after 24 hours within the experimental/human errors of the light focusing and energy distribution. In yet another embodiment of the present invention, switching of polarization first time under 405 nm laser light is in the range 300-500% depending of probe frequency and electrical stress. In yet another embodiment of the present invention, switching of polarization first time under white light is in the range 150-250% depending of probe frequency and electrical stressing (FIG. 7).

In yet another embodiment of the present invention, these experiments were repeated to check the back and forth polarization switching and related displacement current under the illumination of light and within the speed of experimental process (2-3 minutes), it was found that around 20-50% polarization can switch back and forth depending on the probe frequencies and nature of light source (FIG. 8).

Another aspect of the present invention provides polarization switch back and forth within the different intensities and energies of the illuminated light. The peaks of displacement current for different light energy and frequency for near UV and visible light are different and more prominent compared to the dark switchable polarization, and hence different logic states can be created with suitable use of light frequency and energy. Monochromatic light with various wavelengths from 400 nm to 450 nm will more suitable for logic states.

Figure 9:
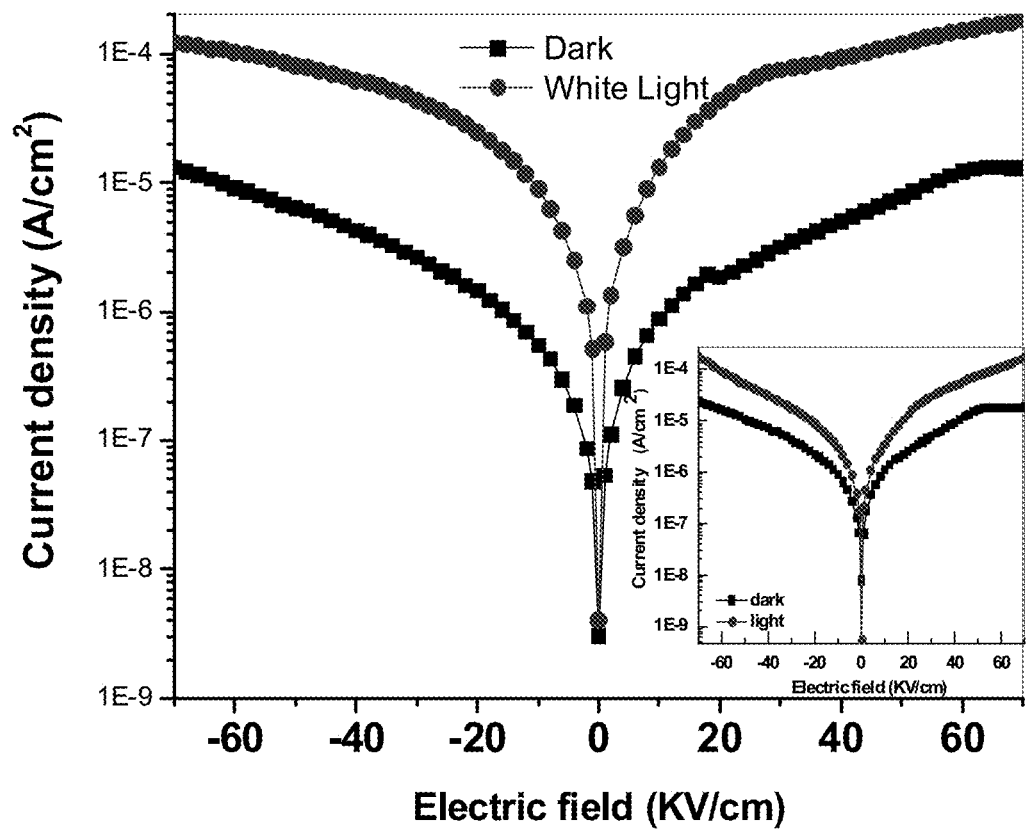
FIG. 9 shows current density versus electric field (J-E) loops of unpoled ceramics (inset shows J-E of poled ceramics).
Figure 10:
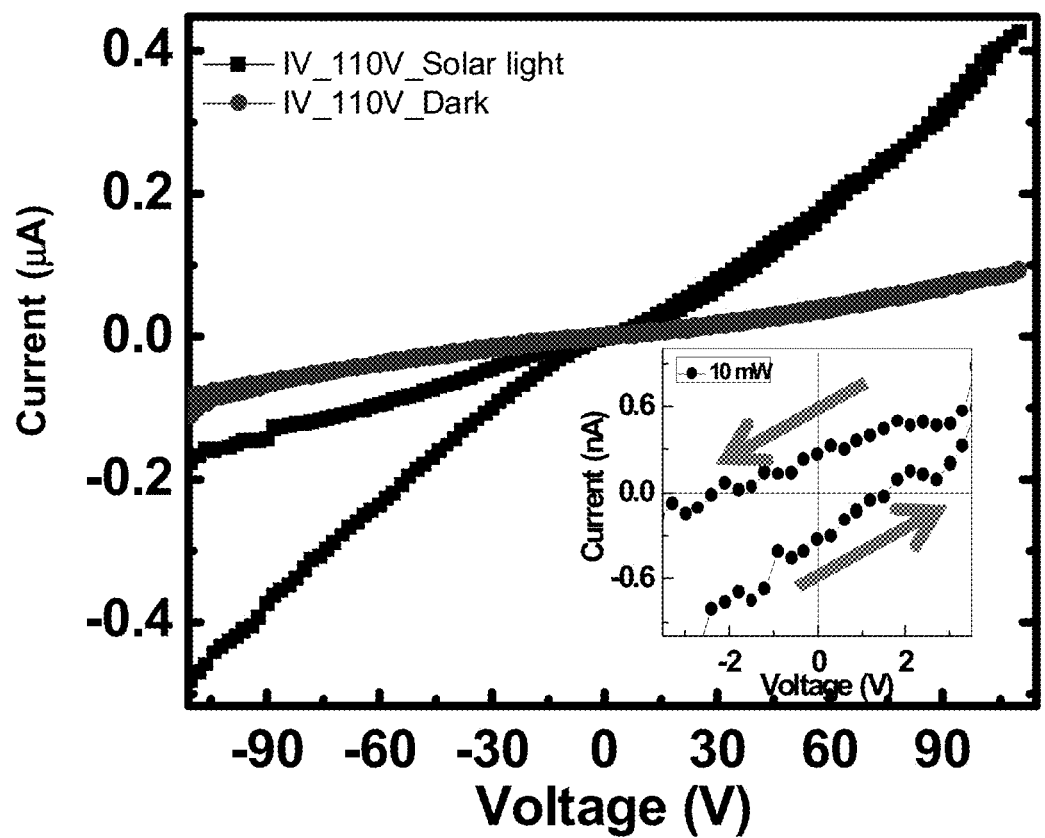
FIG. 10: J-E loops and photo-voltage of unpoled $Pb_{1-x}(Bi_{0.5}Li_{0.5})_x(Ti_{1-y}Zr_y)O_3$ (x=0.4 and y=0.2) electroceramics with small voltage step and small electric field stress to check the open circuit voltage.

Another aspect of the present invention provides current density versus electric field (J-E) loops (FIG. 9) of unpoled $Pb_{1-x}(Bi_{0.5}Li_{0.5})_x(Ti_{1-y}Zr_y)O_3$ (x=0.4 and y=0.2) electro-ceramics. The induced photocurrents were one-two orders of magnitude higher than the dark current, however the same samples after 12 hours of electrical poling (80 KV/cm) shows effectively less photocurrents (inset shows J-E of poled ceramics). The magnitude of photocurrents was good enough to design and disseminate the photo-diode and photo-detector. For electrical measurements, both the electrodes were dissimilar, such as top transparent ITO and bottom silver paint, under the large stress electric field (+/−80 KV/cm), almost similar dark and light current behavior were obtained. Initially, diode like behavior was observed for very low electric field stress (+/−110 V) condition under the illumination of white light. The trends regain back to normal while switching back for photocurrent (FIG. 10).

Another aspect of the present invention provides photocurrent and photo-voltage of unpoled $Pb_{1-x}(Bi_{0.5}Li_{0.5})_x(Ti_{1-y}Zr_y)O_3$ (x=0.4 and y=0.2) electroceramics with small voltage step and small electric field stress. It shows short circuit current ($I_{SC}$) in the range of 0.3 nA and an open circuit voltage of ($V_{OC}$) in the range of 2 V, below than the bandgap of systems (inset of FIG. 10). The main advantage of invented $V_{OC}$ over the normal solar cell $V_{OC}$ is the presence of both second and forth quadrant photocurrent. It depicts that ferroelectric photovoltaic solar cell photo currents depend on the direction of switchable polarization as indicated in the inset of FIG. 10.

Figure 11:
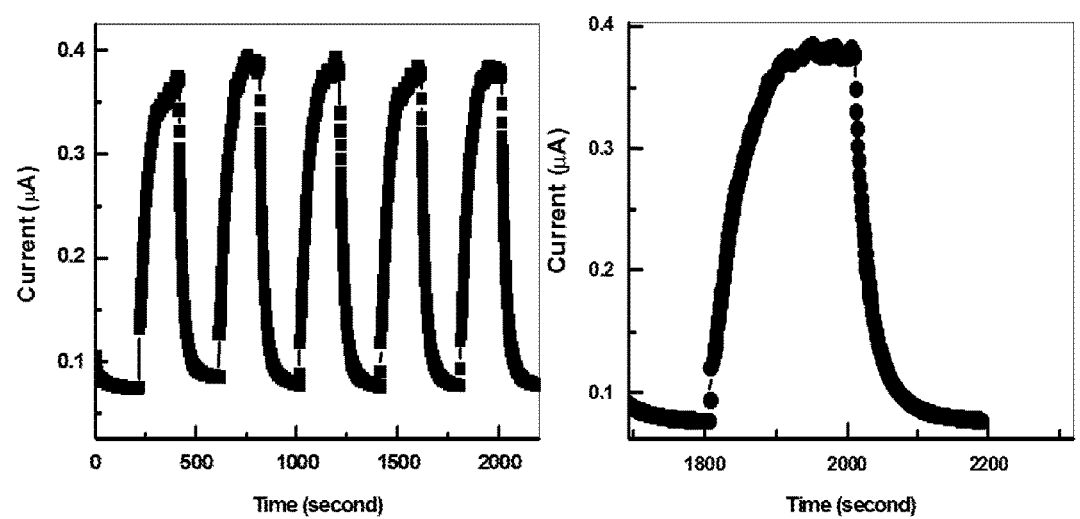
FIG. 11: Switch ON and OFF photo response of unpoled $Pb_{1-x}(Bi_{0.5}Li_{0.5})_x(Ti_{1-y}Zr_y)O_3$ (x=0.4 and y=0.2) electro-ceramics under illumination of white xenon lamp light.

Another aspect of the present invention provides the large photo response with and without illumination of white xenon lamp light (70 mw). Nearly four times enhancement in the photocurrents were observed for unpoled $Pb_{1-x}(Bi_{0.5}Li_{0.5})_x(Ti_{1-y}Zr_y)O_3$ (x=0.4 and y=0.2) electro-ceramics when light was switch ON with a bias voltage of +/−110 V. It took nearly 3 to 4 seconds to reach the saturation of the photocurrent, however decay was fast compared to the growth of photocurrent as can be seen in the FIG. 11.

Another aspect of the present invention provides a unpoled $Pb_{1-x}(Bi_{0.5}Li_{0.5})_x(Ti_{1-y}Zr_y)O_3$ (x=0.4 and y=0.2) electro-ceramics with switchable spontaneous polarization fatigue almost 15-25 percent (a) 1 Hz, & (b) 2 Hz, probe frequency, under the combined electric field stress of +/−80

Figures 12A, 12B:
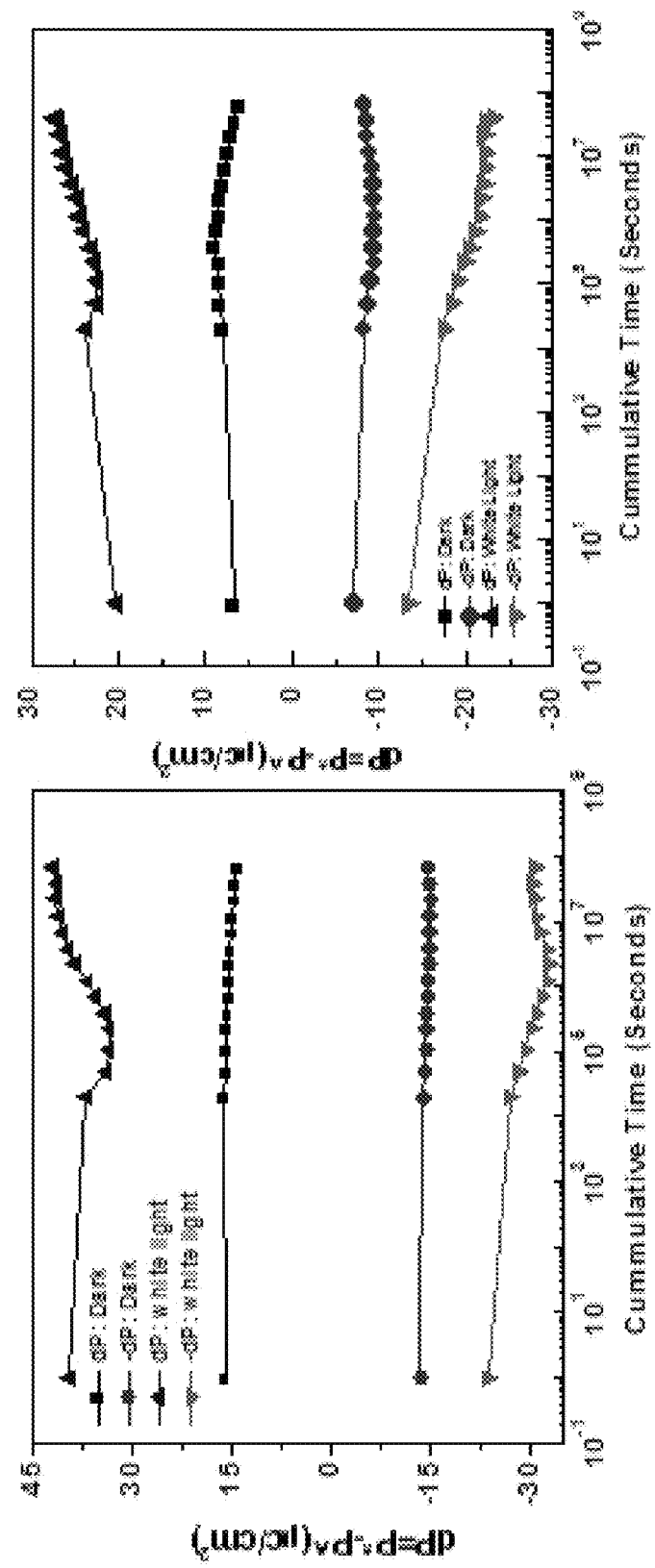
FIG. 12: Switchable polarization as function of time for unpoled $Pb_{1-x}(Bi_{0.5}Li_{0.5})_x(Ti_{1-y}Zr_y)O_3$ (x=0.4 and y=0.2) ceramics with and without white light, (a) 80 KV/cm stress electric field and 1 Hz switching frequency, (b) 80 KV/cm stress electric field and 2 Hz switching frequency.

KV/cm in dark condition (FIG. 12). Both the polarity shows similar trends of fatigue under dark current. Another aspect of the present invention provides the said material with switchable spontaneous polarization improved under the combined electric field stress of +/−80 KV/cm and illumination of white light.

In still another embodiment of the invention, the opto-ferroelectric memory element is characterized by 10-25% fatigue under high stress electric field (80 KV/cm) in the absence of light, and improved fatigue under high stress electric field (80 KV/cm) under illuminated of light less than 10-100 mW/cm$^2$.

Figure 13:
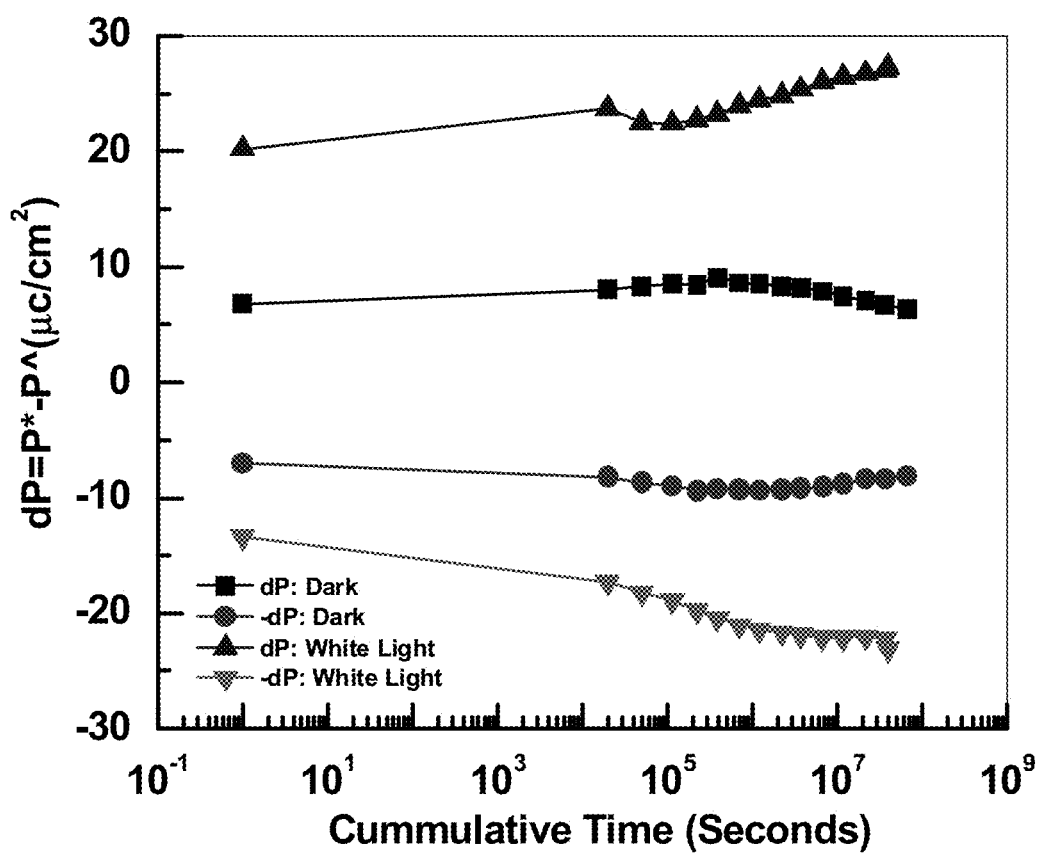
FIG. 13: Switchable polarization of poled $Pb_{1-x}(Bi_{0.5}Li_{0.5})_x(Ti_{1-y}Zr_y)O_3$ (x=0.4 and y=0.2) ceramics with and without white light 80 KV/cm stress electric field and 1 Hz switching frequency.

Another aspect of the present invention provides a poled $Pb_{1-x}(Bi_{0.5}Li_{0.5})_x(T_{1-y}Zr_y)O_3$ (x=0.4 and y=0.2) electro-ceramics with switchable spontaneous polarization fatigue almost 15-25 percent under the combined electric field stress of +/−80 KV/cm in dark condition (FIG. 13). Both the polarity shows similar trends of fatigue under dark current. Another aspect of the present invention provides the said material with switchable spontaneous polarization improved under the combined electric field stress of +/−80 KV/cm and illumination of white light. Both unpoled and poled electro-ceramic show similar fatigue behavior within the said polarization magnitude.

Figure 14:
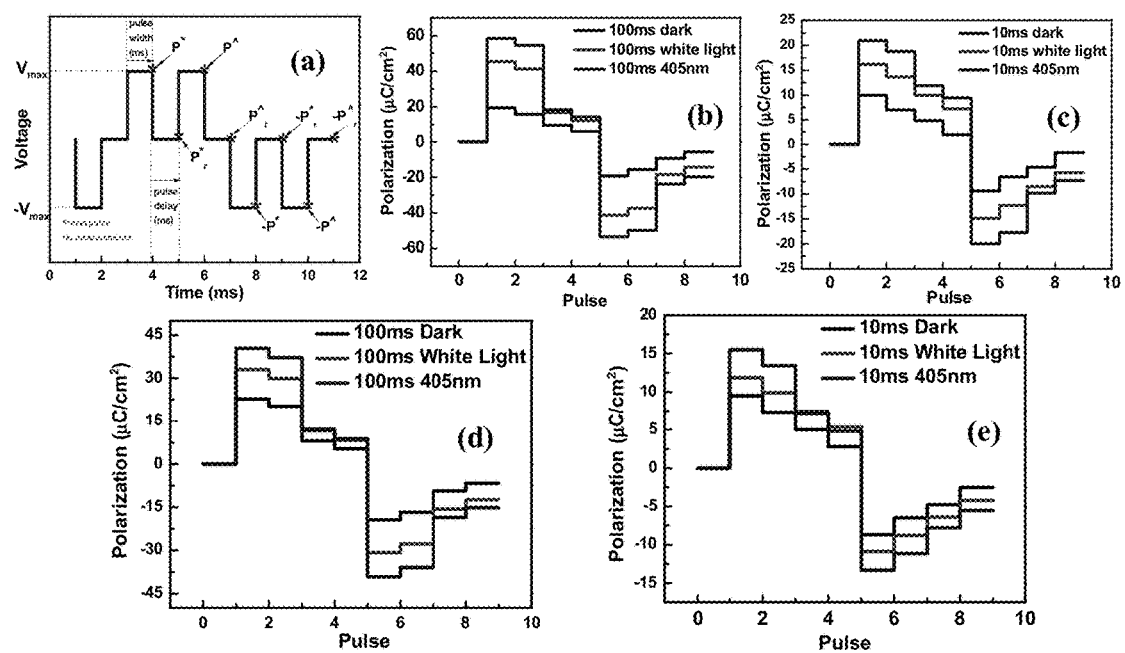
FIG. 14: Switchable polarization of $Pb_{1-x}(Bi_{0.5}Li_{0.5})_x$ $(Ti_{1-y}Zr_y)O_3$ (x=0.4 and y=0.2) ceramic probed with PUND analysis (a) pulse wave configuration, (b) unpoled ceramics at 100 ms time, (c) unpoled ceramics at 10 ms (d) poled ceramics at 100 ms (e) poled ceramics at 10 ms time with and without white light.

Another aspect of the present invention provides switchable polarization probed with PUND analysis (a) pulse wave configuration, (b) unpoled ceramics at 100 ms time, (c) unpoled ceramics at 10 ms (d) poled ceramics at 100 ms (e) poled ceramics at 10 ms time with and without white light. The magnitude of PUND data was higher for slow pulse frequency (FIG. 14).

EXAMPLES

The following examples are given by way of illustration of the working of invention in actual practice and should not be construed to limit the scope of the present invention in any way.

The developed materials may be fabricated as a simple one transistor one capacitor (1T1C) nonvolatile random access memory (NVRAM) ferroelectric cell which may write data bit using external electrical voltage and read the data bit optically using laser light. External electric field will be employed to write the data bit and later optically read out even in the absence of power supply. Different magnitude of laser power and associated polarization may be utilized for different logic states of memory elements, photo-detector, Radio-frequency identification (RFID) readers, and ferroelectric photovoltaic cells. The developed materials may be useful as ferroelectric photovoltaic devices which can generate power under illumination of sunlight.

EXAMPLE-1

Preparation of Opto-Ferroelectric Material by Solid Route
Opto-ferroelectric $Pb_{1-x}(Bi_{0.5}Li_{0.5})_x(Ti_{1-y}Zr_y)O_3$ (x=0.2 to 0.8, and y=0.2 to 0.6) (PBLZT) electro-ceramic samples were prepared by a solid state route. Analytical-purity oxides, lead oxide (PbO) (99.5%), zirconium oxide ($ZrO_2$) (99.86%), Titanium oxide ($TiO_2$) (99.96%), Bismuth oxide ($Bi_2O_3$) (99.99%) and lithium carbonate ($Li_2CO_3$) (97%) (Alfa Aesar) were used as raw materials. The powder of the above mentioned metal oxides were mechanically mixed at least two hours in the liquid alcoholic medium such as isopropyl alcohol (IPA) and ethanol, and then it was calcined at 800-850° C. for 12 h in a closed alumina crucible. 10% excess of PbO and 2% $Bi_2O_3$ and 2% $Li_2CO_3$ was added to each composition to compensate Pb, Bi, and Li deficiency during the high temperature processing. Poly (vinyl alcohol) solutions (1%) were added to the calcined powders as a binder. The dried powders were first filtered using a 150 µm-mesh sieve and then pressed using a hydrostatic press 6-8 Ton into pellets of 10 mm diameter. The pressed pellets were sintering at 1100-1200° C. for 2 h. All heat treatments were performed in air to prevent the PbO loss during high temperature sintering and to maintain desired stoichiometric. An equilibrium PbO vapor pressure was established by fully covered alumina crucible with $PbZrO_3$ as medium on the top of alumina power where these pellets were kept for sintering.

EXAMPLE-2

Preparation of PBLZT Electro-Ceramic Samples by a Solution-Gel Technique
PBLZT electro-ceramic samples can be prepared by a solution-gel technique. In this process, the solution of lead acetate, titanium isopropoxide, zirconium isopropoxide, bismuth acetate, and lithium acetate with mol percentage mentioned in the formula is prepared in the solvent 2 methoxy ethanol, and acetic acid, later for gel formation, a small amount of ethylene glycol may be added in the solution. The stability of solution can be checked to keep the solution for long time at least 30 days. The stable solution is used to prepare the thin films using spin coating technique with growth conditions such as: solution molarity ~0.2-0.3, spin coating speed in the range of 3000-5000 rpm, pyrolysis at 300° C. for 2 minutes to remove the organics and sintering at 600-700° C. for phase formation. Final films may be used directly for device fabrication process.

EXAMPLE 3

Preparation of PBLZT Film by Pulsed Laser Deposition
The pulsed laser deposition (PLD) technique can also be used to prepare the PBLZT thin films. In this process, the one inch target of the developed material (PBLZT) is prepared by the solid-state reaction technique using the similar conditions as mentioned in the process method. The prepared target is used in PLD to prepare the thin films. The growth conditions may as follows: substrate temperature ~600-750° C., oxygen partial pressure ~100-200 mbar, Laser energy density ~1-3 J/cm2, and target to substrate distance in the range of 4-5 cm. In this process high quality epitaxial thin film may be prepared which may directly integrate with the silicon technology for device fabrication.

The thin films of the aforementioned materials can be prepared by various other thin film growth techniques such as rf-magnetron sputtering, chemical vapor deposition process, metalorganic chemical vapour deposition (MOCVD), atomic layer deposition etc., respectively. Optimized parameters and growth conditions depend on the ambient conditions and fabrication processes.

EXAMPLE-4

Preparation of Memory Material Using PBLZT Opto-Ferroelectric Materials
The above said PBLZT opto-ferroelectric materials in their thin film form with 1T1C memory cell configuration may be used for practical ferroelectric random access memory (FeRAM) device applications with extra degree of freedom such as optically tunable logic states. It is expected to have 128 Mbit memory cell using the developed material with high logic states density. One can fabricate high quality PBLZT thin films which can be directly integrated to the silicon technology for logic and memory devices. The thick PBLZT films with suitable top (semi transparent Au or ITO) and bottom electrodes may be useful for bulk ferroelectric photovoltaic devices for power generation.

The aforementioned material shows high ON and OFF light assisted switchable current which indicates its suitability as photo-detector near UV light (300 to 400 nm). FeRAM based Radio-frequency identification (RFID) is a useful for data carrier applications, factory-automation, maintenance, asset-management, and logistic-tracking applications. This system is also resistant to gamma-ray sterilization which makes it useful in the medical, pharmaceutical, biomedical, foods, and cosmetic industries applications. The high endurance greater than $10^{10}$ write and read process make it suitable for memory elements. It is also useful for high frequency (HF ~13.56 MHz) and ultra high frequency (UHF ~860 MHz-960 MHz) applications.

The thin films of the aforementioned materials can be prepared by various other thin film growth techniques such as rf-magnetron sputtering, chemical vapor deposition process, metalorganic chemical vapour deposition (MOCVD), atomic layer deposition etc., respectively. Optimized parameters and growth conditions depend on the ambient conditions and fabrication processes.

Advantages of the Present Invention

The main advantages of the present invention are: —
1) The present invention provides optical switch and opto-electric memory devices which are in high demand for the next generation NVRAM (nonvolatile random access memory) applications.
2) The present invention provides electrically write and optically read FeRAM with exceptionally high density memory bits and less power consumption, low leakage current and less heat dissipation.
3) The present invention provides photo-ferroelectric materials showing exceptionally high opto-ferroelectric effect.
4) In the present invention, multi-states memory logic is created with suitable use of monochromatic laser wavelength for writing and reading the logic states.
5) It shows characteristic features with $V_{OC}$~2 V and $I_{SC}$~0.3 nA.
6) In the present invention, use of weak white light or monochromatic light or near UV light induce large amount of photocurrent and the said effect can be utilized for design and fabrication of photo-diode and photodetector.
7) In the present invention, the ratio of ON/OFF states of dark and light current possesses significant magnitude to design and develop the multi-states photocurrent based microelectronic devices.
8) In the present invention, photo-ferroelectric materials show significantly low fatigue in dark light and improved polarization under illumination satisfying the basic requirement of memory devices.

The invention claimed is:
1. Multi-states nonvolatile opto-ferroelectric memory element comprising:
an opto-ferroelectric memory material comprised of:

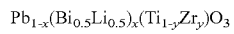

wherein
x=0.2 to 0.8
y=0.2 to 0.6
said memory material (PBLZT) photovoltaic ferroelectric material includes a single-phase opto-ferroelectric materials, photovoltaic and multi-states ferroelectric memory material.
2. The opto-ferroelectric memory element as claimed in claim 1, wherein spontaneous polarization is in the range of 4-30 $\mu C/cm^2$ with and without using illumination of light from near UV to visible region frequencies by said opto-ferroelectric memory element and said probed frequencies are ranging from 0.1 Hz to 10 Hz.
3. The opto-ferroelectric memory element as claimed in claim 2, wherein illumination used is white light tungsten filament at 20-100 $mW/cm^2$ or white light xenon lamp at 20-100 $mW/cm^2$ and monochromatic light source is 405 nm at 30-50 mW.
4. The opto-ferroelectric memory element as claimed in claim 1, wherein fatigue ranges from 10-25% under high stress electric field (80 KV/cm) in the absence of light, and fatigue is improved under high stress electric field (80 KV/cm) under illuminated light ranging less than 10-100 $mW/cm^2$.
5. The opto-ferroelectric memory element as claimed in claim 1, wherein ON and OFF photocurrent is ranging from 4:1 to 6:1 depending on 405 nm (10-50 mW) laser and white light source.
6. The opto-ferroelectric memory element as claimed in claim 1, wherein white and monochromatic light are used to switch the polarization states, and concerned logic states for multi-states memory elements.
7. The opto-ferroelectric memory element as claimed in claim 1, wherein white light and 405 nm wavelength laser source is used, and wherein the laser source is selected from complete range of near UV and visible light for realizing the multi nonvolatile logic states.
8. The opto-ferroelectric memory element as claimed in claim 1, wherein dielectric constant is ranging below 1000 and low tangent loss is ranging below 0.05 (<0.05) over temperature ranging below 400° C. and frequency ranging from 50 Hz to 1 MHz.
9. The opto-ferroelectric memory element as claimed in claim 1, wherein switching of polarization is ranging from 100-500% first time under 405 nm laser light depending on probe frequency and electrical stress.
10. The opto-ferroelectric memory element as claimed in claim 1, wherein switching is fast and repeatability of polarization is ranging from greater than two minutes and less than 30 minutes by using 405 nm laser light, and wherein the polarization is in the range of 20-50% depending on probe frequency and electrical stress.
11. The opto-ferroelectric memory element as claimed in claim 1, further comprising multi-states memory with an electrically WRITE operation and optically READ operation and vice-versa, and/or combination of these two, and/or separately by electric field and different wavelength of monochromatic laser light in near UV and visible regions.
12. The opto-ferroelectric memory element as claimed in claim 1, wherein transformer oil or silicon oil or combination thereof is used as electrical stress medium.
13. Opto-ferroelectric nonvolatile multistate memory cells, visible or weak UV detector, perovskite based photovoltaic and miniaturized microelectronic memory devices prepared by multi-states nonvolatile opto-ferroelectric memory element as claimed in claim 1.

14. A process for preparation of opto-ferroelectric material,

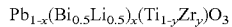

wherein x=0.2 to 0.8 and y=0.2 to 0.6,
said process comprising steps of:
i) physical mixing of ingredient oxides of PbO (99.5%), $ZrO_2$ (99.86%), $TiO_2$ (99.96%), $Bi_2O_3$ (99.99%) and $Li_2CO_3$ (97%) in a ratio of x=0.2 to 0.8, and y=0.2 to 0.6 and further mechanical mixing in liquid alcoholic (Isopropyl alcohol—IPA) media in the range of 5 to 10 ml with 99.9% purity, and mol fraction of $Pb_{1-x}(Bi_{0.5}Li_{0.5})_x(Ti_{1-y}Zr_y)O_3$ (x=0.4 & 0.5, and y=0.2) (PBLZT) electro-ceramics;
ii) calcining composites of step (i) at a temperature in the range of 800-850° C. for a period of 11-13 hours to get the desired phase followed by X-ray diffraction (XRD) study to verify the phase purity and crystallinity;
iii) sintering composites of step (ii) at a temperature in the range of 1100-1200° C., to obtain desired opto-ferroelectric material; and
iv) sintering composites of step (iii) were further processed for mechanical grinding and polishing to get the desired thickness in the range of 400 to 600 microns of opto-ferroelectric material.

* * * * *